United States Patent
Schmeller et al.

(10) Patent No.: US 9,178,424 B2
(45) Date of Patent: Nov. 3, 2015

(54) SWITCHED MODE DCDC CONVERTER EFFICIENCY IMPROVEMENT BY ADAPTIVE DRIVER STAGE

(71) Applicant: Texas Instruments Deutschland GmbH, Freising (DE)

(72) Inventors: Hans Schmeller, Woerth (DE); Erich Bayer, Thonhausen (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 14/295,410

(22) Filed: Jun. 4, 2014

(65) Prior Publication Data

US 2015/0097535 A1  Apr. 9, 2015

Related U.S. Application Data

(60) Provisional application No. 61/888,883, filed on Oct. 9, 2013.

(51) Int. Cl.
*H02M 3/158* (2006.01)

(52) U.S. Cl.
CPC ..................................... *H02M 3/158* (2013.01)

(58) Field of Classification Search
CPC ............... H02M 2001/0045; H02M 3/158; H02M 3/1584; H02M 3/1588; H02M 3/156; H02M 3/157; G05F 1/56; G05F 3/24

USPC .......... 323/265, 268, 271, 282, 283, 285, 351
See application file for complete search history.

(56) References Cited

U.S. PATENT DOCUMENTS

| | | | |
|---|---|---|---|
| 4,399,500 A * | 8/1983 | Clarke et al. ..................... | 363/97 |
| 4,678,984 A * | 7/1987 | Henze ........................... | 323/285 |
| 7,072,198 B2 * | 7/2006 | Krug et al. ..................... | 363/127 |
| 7,142,401 B2 * | 11/2006 | Daniels et al. .................. | 361/18 |
| 7,148,670 B2 * | 12/2006 | Inn et al. ....................... | 323/283 |
| 7,327,129 B2 * | 2/2008 | Chen et al. ..................... | 323/285 |
| 7,518,351 B2 * | 4/2009 | Liao et al. ..................... | 323/284 |
| 8,427,130 B2 * | 4/2013 | Brokaw ........................ | 323/316 |
| 8,513,935 B2 * | 8/2013 | Brokaw ........................ | 323/285 |
| 2010/0039735 A1 * | 2/2010 | Trescases et al. ............... | 361/18 |

* cited by examiner

*Primary Examiner* — Adolf Berhane
(74) *Attorney, Agent, or Firm* — William B. Kempler; Frank D. Cimino

(57) ABSTRACT

In a switched mode inductive DCDC converter having a first mode that conducts a first current path through an inductor and through a first switch, and a second mode that conducts a second current path through the inductor and through a second switch, a detecting component detects a parameter. The detecting component outputs a biasing signal extend the turn OFF time of one of the switches in order to decrease a voltage build up on the other switch.

20 Claims, 12 Drawing Sheets

SWITCHED MODE DCDC CONVERTER EFFICIENCY IMPROVEMENT BY ADAPTIVE DRIVER STAGE

The present application claims priority from: U.S. Provisional Application No. 61/888,883 filed Oct. 9, 2013, the entire disclosure of which is incorporated herein by reference.

BACKGROUND

The present invention is generally drawn to a switched mode inductive circuit.

FIG. 1 illustrates a conventional switched mode inductive DCDC converter 100.

As shown in the figure, switched mode inductive DCDC converter 100 includes an input node 102, an inductor 104, a controlling component 106, a power stage 108, a capacitor 110 and an output node 112. Controlling component 106 includes a driving component 114, a driving component 116 and a controller 118. Driving component 114 includes a switch 120 and a switch 122. Driving component 116 includes a switch 124 and a switch 126. Power stage 108 includes a switch 128 and a switch 130. Also shown in switched mode inductive DCDC converter 100, are parasitic inductances 132, 134 and 136.

In the example switched mode inductive DCDC converter 100, switch 120 is a p-channel field effect transistor (p-FET), switch 122 is an n-channel field effect transistor (n-FET), switch 124 is a p-FET, switch 126 is an n-FET, switch 128 is a p-FET and switch 130 is an n-FET.

Inductor 104 is disposed between input node 102 and power stage 108. P-FET 128 is disposed between inductor 104 and output node 112. N-FET 130 is disposed between inductor 104 and ground. Inductor 104, n-FET 130 and p-FET 128 are connected at a node 158. Capacitor 110 is disposed between output node 112 and ground. P-FET 120 and n-FET 122 are disposed between input node 102 and ground, wherein the source of p-FET 120 is connect to input node 102 and wherein the source of n-FET 122 is connected to ground. The drain of p-FET 120 and the drain of n-FET 122 are connected to the gate of n-FET 130 of power stage 108 via a line 138. The gate of p-FET 120 and the gate of n-FET 122 are connected to controller 118 via a line 140. P-FET 124 and n-FET 126 are disposed between input node 102 and ground, wherein the source of p-FET 124 is connect to input node 102 and wherein the source of n-FET 126 is connected to ground. The drain of p-FET 124 and the drain of n-FET 126 are connected to the gate of p-FET 128 of power stage 108 via a line 142. The gate of p-FET 124 and the gate of n-FET 126 are connected to controller 118 via a line 144.

Input node 102 is operable to receive an input voltage, $V_{in}$. Inductor 104 is operable to output a first voltage, $V_1$, in a first state and a second voltage, $V_2$, in a second state.

Controlling component 106 is operable to control power stage 108. In particular, controller 118 is operable to control driving component 114 via a control signal 146 on line 140, and is further operable to control driving component 116 via a control signal 148 on line 144. Control signal 146 alternately actuates p-FET 120 and n-FET 122, which in turn provides a bias signal 150 to control n-FET 130 of power stage 108 via line 138. Similarly, control signal 148 alternately actuates p-FET 124 and n-FET 126, which in turn provides a bias signal 152 to control p-FET 128 of power static 108 via line 142.

Power stage 108 operates in a first mode, wherein a current path indicated by arrow 154 travels through inductor 104, through n-FET 130 and to ground. Power stage 108 operates in a second mode, wherein a current path indicated by arrow 156 travels through inductor 104, through p-FET 128 and to output node 112.

Capacitor 110 acts as a low pass filter.

In operation, for purposes of discussion, let conventional switched mode inductive DCDC converter 100 be operating in a first mode, wherein current travels along current path 154. In this mode, controlling component 106 first control power stage 108 such that p-FET 128 is OFF and n-FET 130 is ON. In this case, input node 102 receives $V_{in}$, which creates a current along current path 154, through inductor 104, through n-FET 130, through parasitic inductor 136 and finally to ground.

Now, let conventional switched mode inductive DCDC converter 100 switch from the first mode to the second mode, wherein during the switch, there is no current path. While switching between modes, controlling component 106 controls power stage 108 such that, while p-FET 128 remains OFF, n-FET 130 is turned OFF. There should be some time with which p-FET 128 and n-FET 130 are both OFF, to avoid the situation where both switches may be ON, which would short output node 112 to ground.

Then, let controlling component 106 control power stage 108 such that p-FET 128 is turned ON and n-FET 130 remains OFF. In this case, input node 102 receives $V_{in}$, which creates a current along current path 156, through inductor 104, through p-FET 128, through parasitic inductor 132 and finally to output node 112.

Conventional switched mode inductive DCDC converter 100 may continue to switch back and forth between the two modes as discussed above, wherein there is a period during the switching when both of p-FET 128 and n-FET 130 are OFF.

At any switching event, the current through inductor 104 needs to change from current path 154 to current path 156, or vice versa. This produces switching loses and therefore reduces the efficiency of the voltage conversion from $V_{in}$ to $V_o$. As such, it would be beneficial to switch as quickly as possible. The problem with quickly switching modes is that there are parasitic inductances coming, from bonds wires, PCB and passive components, for example as shown as parasitic inductances 132, 134 and 136. The parasitic inductances do not allow the current to quickly change from current path 154 to current path 156, or vice versa, in zero time. When the dI/dt in the parasitic components reaches high levels that are too high, the parasitic inductors cause voltage ringing. Further, the parasitic components may cause a voltage build up at the drain of one of p-FET 128 or n-FET 130 that could destroy these components. This voltage ringing and voltage build up will now be further described with additional reference to FIGS. 2-4.

FIG. 2 illustrates the voltage at node 158, between the n-FET 130 and p-FET 128, when conventional switched mode inductive DCDC converter 100 switches modes.

The figure includes a graph 200 and a graph 202. Graph 200 includes a y-axis 204, an x-axis 206, a pulse 208 and a pulse 210. Graph 202 includes a y-axis 212, an x-axis 214, a function 216 and a threshold voltage, $V_{th}$, indicated by a dotted line 217.

Y-axis 204 has a scale of zero, corresponding to when a FET is OFF, or 1 unit, corresponding to when a FET is ON. X-axis 206 is time and is in units of microseconds. Pulse 208 corresponds to n-FET 130 being ON until a time $t_1$. Line 220 corresponds to n-FET 130 turning OFF, until it is fully OFF at time $t_2$. Therefore, in this case, n-FET 130 takes a period $\Delta t_1$ to turn OFF. At some time later, p-FET 128 turns ON. Line 221 corresponds to p-FET 128 turning ON, until p-FET 128 is fully ON as shown by line 210.

Y-axis 212 corresponds to a voltage at the drain of n-FET 130 and is measured in volts. X-axis 214 is time and is in units of microseconds. Function 216 corresponds to a voltage at the drain of n-FET 130 as a function of time. Function 216 includes a rising portion 218, a maximum portion 220 and a small ringing portion 222. Dotted line 217 corresponds to $V_{th}$, wherein n-FET 130 risks being damaged.

As shown in graph 200, n-FET 130 does not immediately turn OFF. It starts to turn OFF at time $t_1$, and finishes turning OFF at time $t_2$, after $\Delta t_1$. During that period turning OFF, the current changes from current path 154 to current path 156, creating a parasitic voltage $V_{par}$:

$$V_{par} = L * dI/dt, \quad (1)$$

wherein L s the inductance of parasitic inductors 132 and 136 and dI/dt is the current change. This $V_{par}$ builds at the drain of n-FET 130. The voltage reaches a maximum as shown by maximum portion 220. The slope of rising portion 218 is a function of the rate at which n-FET 130 turns OFF, i.e., $\Delta t_1$. Parasitic capacitances in n-FET 130 resonate with the parasitic inductors within the circuit to generate ringing portion 222. The generation of ringing portion 222 will now be described in greater detail with reference to FIG. 3.

FIG. 3 illustrates parasitic capacitances and inductances associated with n-FET 130 of FIG. 1.

As shown in FIG. 3, a parasitic capacitance 302 is disposed at node 158. Further, in addition to parasitic inductance 136, there exists a parasitic diode 304 in parallel with p-FET 128 not shown), wherein the anode of parasitic diode 304 is disposed toward node 158.

FIG. 3 shows the situation at the moment when n-FET 130 is turned OFF. In this situation, the inductor current, at the moment when n-FET 130 could no longer conduct it, needs to go through parasitic inductance 136 and parasitic diode 304. However an inductor cannot have such a jump in current. This means that physical inductance continues to drive current while it takes a while until parasitic inductance 136 to build up the current. Until the full current can be conducted by parasitic inductance 136, the remaining current is flowing into parasitic capacitance 302, which keeps increasing the voltage at node 158. Parasitic inductance 136 builds up current with a change in the current, i.e., $$dI/dt = V_{pi}/L_{pi} \quad (2)$$

wherein $V_{pi}$ is the voltage across parasitic inductance 136 and wherein $L_{pi}$ is the inductance of parasitic inductance 136.

Returning to FIG. 2, if maximum portion 220 were to be greater than $V_{th}$, then there is a possibility that n-FET 130 may be damaged. This may happen under many circumstances, non-limiting examples of which include operating conventional switched mode inductive DCDC converter 100 at extreme temperatures, and individual component degradation resulting from age or use.

For example, for purposes of discussion, let the period that it takes n-FET 130 to turn OFF increase as a result of operation of conventional switched mode inductive DCDC converter 100 under an extreme temperature. The resulting effect of ringing and voltage build up will be described in greater detail with reference to FIG. 4.

FIG. 4 illustrates the voltage at node 158, between the n-FET 130 and p-FET 128, when conventional switched mode inductive DCDC converter 100, operating in a less than optimum manner, switches modes.

FIG. 4 includes a graph 400 and a graph 402. Graph 400 includes a y-axis 404, an x-axis 406, a pulse 408 and pulse 210. Pulse 208 of FIG. 2 is additionally shown as dotted lines for comparison purposes. Graph 402 includes a y-axis 412, an x-axis 414, a function 416 and threshold voltage, $V_{th}$, indicated by dotted line 217. Function 216 of FIG. 2 is additionally shown as a dashed line for comparison purposes.

Y-axis 404 has a scale of zero, corresponding to when a FET is OFF, or 1 unit, corresponding to when a FET is ON. X-axis 406 is time and is in units of microseconds. Pulse 408 corresponds to n-FET 130 being ON until time $t_1$. Line 410 corresponds to n-FET 130 turning OFF, until it is fully OFF at time $t_3$, wherein $t_3$ is less than $t_2$ discussed above with reference to FIG. 2. Therefore, in this case, n-FET 130 takes a period of $\Delta t_2$ to turn OFF. At some time later, p-FET 128 turns ON.

Y-axis 412 corresponds to a voltage at the drain of n-FET 130 and is measured in volts. X-axis 414 is time and is in units of microseconds. Function 416 corresponds to a voltage at the drain of n-FET 130 as a function of time. Function 416 includes a rising portion 418, a maximum portion 420 and a ringing portion 422.

As shown in graph 400, n-FET 130 does not immediately turn OFF. It starts to turn OFF at time $t_1$, and finishes turning OFF at time $t_3$, after $\Delta t_2$. During that period of turning OFF, just as discussed above, the current changes from current path 154 to current path 156, creating a parasitic voltage $V_{par}$. In this case, the current change is more drastic than that discussed above with reference to FIG. 2. This is because the period, $\Delta t_2$, for n-FET 130 to totally turn OFF in this case, is much smaller than the period, $\Delta t_1$, discussed above with reference to FIG. 2. This can easily be seen by comparing pulse 208 with pulse 408 in FIG. 4.

Just as in the previous example discussed with reference to FIG. 2, in this example $V_{par}$ builds at the drain of n-FET 130. The slope of rising portion 418 is a function of the rate at which n-FET 130 turns OFF, i.e., in this case, $\Delta t_2$. In this case, the slope of rising portion 418 is much greater than the slope of rising portion 218 of function 216. The increased slope translates into a greater voltage build up, which can be seen by comparing maximum portion 420 to maximum portion 220 of function 216. In fact, in this case, maximum portion 420 is greater than $V_{th}$, thus risking damage to n-FET 130.

Finally, similar to the situation discussed above with reference to FIG. 2, in this case, parasitic capacitances in n-FET 130 resonate with the parasitic inductors within the circuit to generate ringing portion 422.

What is needed is needed is a switched mode inductive DCDC converter that decreases the likelihood of damage to its components, decreases ringing, and maximizes the overall speed of the circuit

BRIEF SUMMARY

The present invention provides a switched mode inductive DCDC converter that decreases the likelihood of damage to its components, decreases ringing, and improves voltage, conversion efficiency by providing faster switching.

In accordance with aspects of the present invention, a circuit is provided that is operable to receive an input DC voltage and to output an output DC voltage. The circuit includes an inductor, an output node, a first FET, a second FET, a controller, and a detecting component. The inductor is operable to generate inductor convened voltage based on the input DC voltage. The output node is operable to output the output DC voltage. The first FET is disposed in series between the inductor and the output node. The second FET is disposed in series between the inductor and ground. The controller is operable to generate a control signal to control one of the first FET and the second FET. The control signal is able to control the one of the first FET and the second FET to be in a first state, to control the one of the first FET and the second FET to be in a second state, to control the one of the first FET and the second FET to switch from the first state to the second state and to control the one of the first FET and the second FET to switch from the second state to the first state. The detecting component is operable to detect a parameter associated with one of the first FET and the second FET and to output a bias signal based on the detected parameter. In the first state, one of the first FET and the second FET is ON and the other of the first FET and the second FET is OFF. In the second state, the one of the first FET and the second FET is OFF and the other of the first FET and the second FET is ON. The detecting component is arranged with the controller such that the bias signal modifies the control signal so as to extend a turn OFF time. The switching time is one of when the first FET switches from the first state to the second state, when the second FET switches from the first state to the second state, when the first FET switches from the second state to the first state, and when the second FET switches from the second state to the first state.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

One aspect of the present invention implements a bias component to extend the turn OFF period of n-FET 130 by a fixed amount.

Another aspect of the present invention implements a voltage sensing for the drain voltage of n-FET 130, which is then used to regulate the turn OFF period of n-FET 130. In the case of a boost converter and positive load current, the controlling of the turn OFF period of n-FET 130 is the most critical switching event.

These aspects, and others, will now be further described with greater detail with reference to FIGS. 5-13.

The aspect drawn to extending the turn OFF period of n-FET 130 via a bias component will first be described with reference to FIGS. 5-6.

Figure 5:
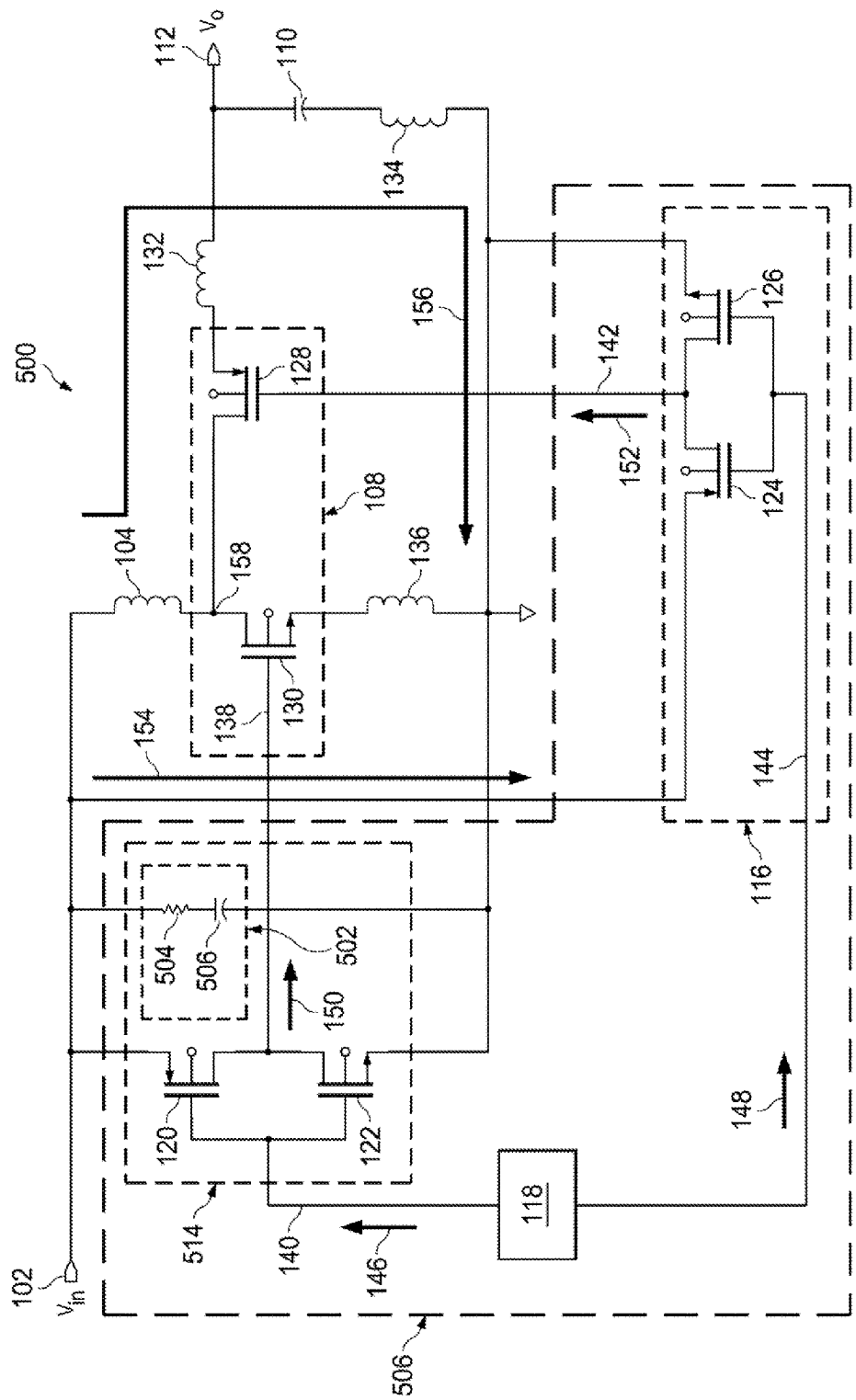
FIG. 5 illustrates an example of an embodiment of a switched mode inductive DCDC converter, in accordance with aspects of the present invention.

FIG. 5 illustrates an example of an embodiment of a switched mode inductive DCDC converter 500, in accordance with aspects of the present invention.

As shown in the figure, switched mode inductive DCDC converter 500 is similar to conventional switched mode inductive DCDC converter 100 discussed above with reference to FIG. 1, but differs in that: controlling component 106 of conventional switched mode inductive DCDC converter 100 has been replaced with controlling component 506 in switched mode inductive DCDC converter 500; and driving component 114 of conventional switched mode inductive DCDC converter 100 has been replaced with driving component 514 in switched mode inductive DCDC converter 500. Further, driving component 514 differs from driving component 114 in that driving component 514 further includes a bias component 502.

A difference in function and operation between controlling component 106 of conventional switched mode inductive DCDC converter 100 and controlling component 506 of switched mode inductive DCDC convener 500 and the only difference between function and operation of driving component 114 of conventional switched mode inductive DCDC converter 100 and driving component 514 of switched mode inductive DCDC converter 500 lies in the addition of bias component 502.

Bias component 502 is arranged between input node 102 and the source of n-FET 130. Bias component 502 generates a voltage bias that is used by n-FET 130 for comparison against the drain voltage. If the drain voltage of n-FET 130 increases beyond the voltage bias generated by bias component 502, then the switching process of n-FET 130 is influenced in real time. In other words, the turn OFF period of n-FET 130 can be changed.

In this example embodiment, bias component 502 includes a resistor 504 in series with a capacitor 506. This is a non-limiting example, wherein other components may be used that are able to generate a voltage.

As mentioned above with reference to FIG. 4, there may be circumstances where the turn OFF period of n-FET 130 decreases to the point where n-FET 130 risks being damaged. Bias component 502 helps to avoid damaging n-FET 130 in these situations. The effect on voltage build up and ringing from the addition of bias component 502, which in this example includes resistor 504 and capacitor 506, will now be described in greater detail with reference to FIG. 6.

Figure 6:
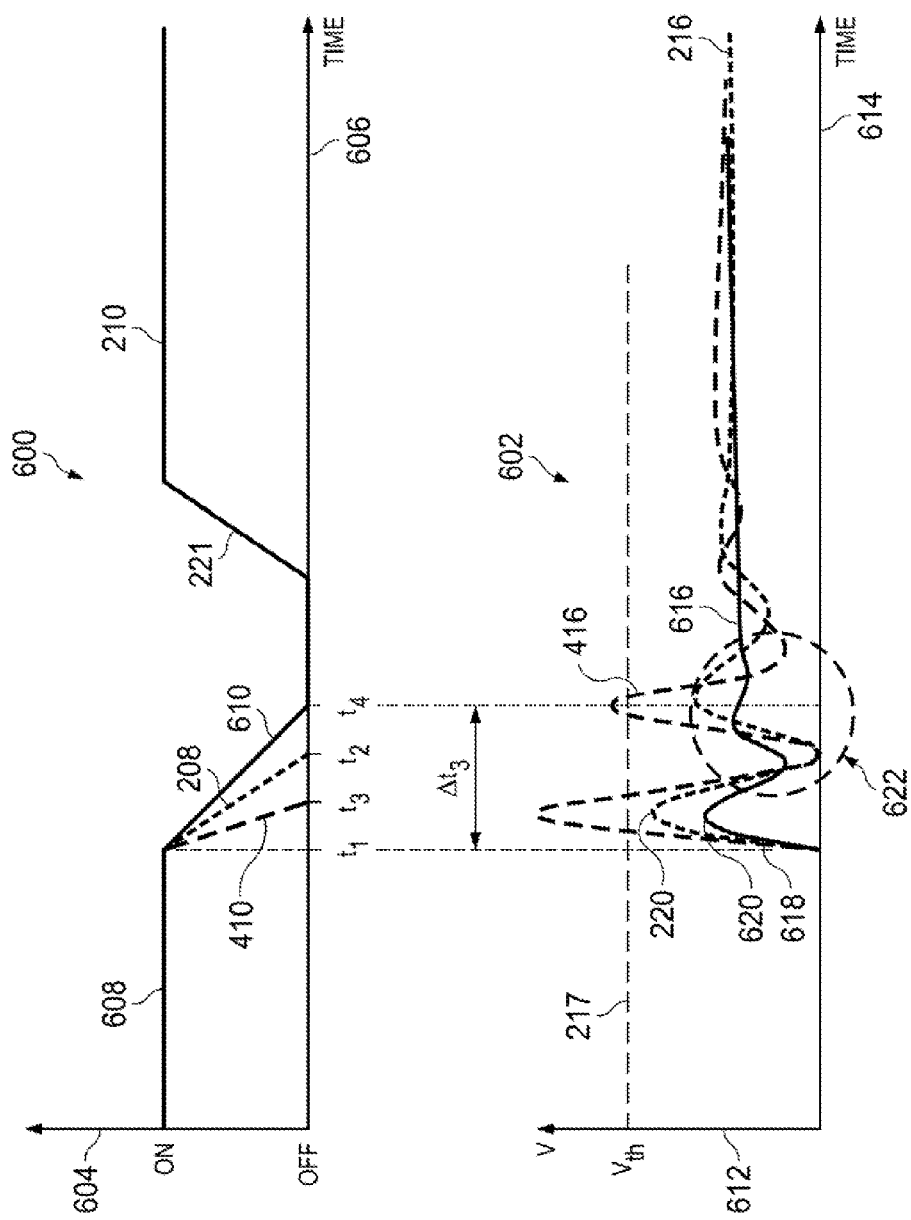
FIG. 6 illustrates the voltage at a node between the n-FET and a p-FET when the switched mode inductive DCDC converter of FIG. 5 switches modes.

FIG. 6 illustrates the voltage at the source of p-FET 128 when conventional switched mode inductive DCDC converter 100 switches modes.

Figure 2:
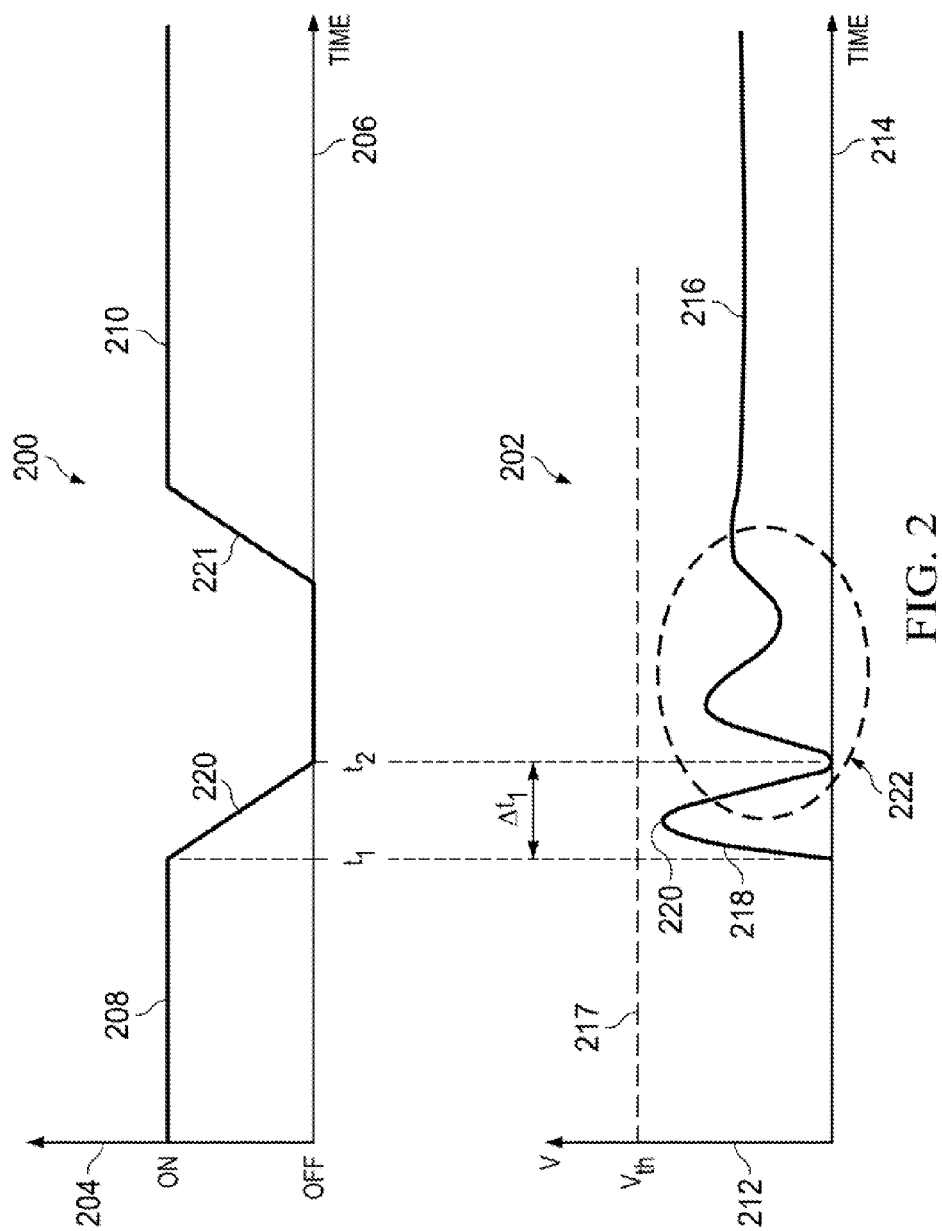
FIG. 2 illustrates the voltage at a node between the n-FET and p-FET when the conventional switched mode inductive DCDC converter of FIG. 1 switches modes.
Figure 3:
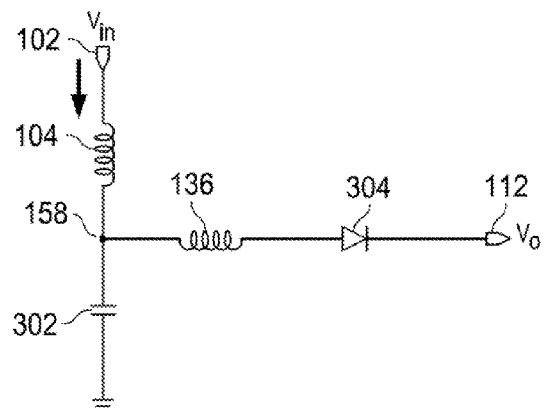
FIG. 3 illustrates parasitic capacitances and inductances associated with an n-FET of FIG. 1.
Figure 4:
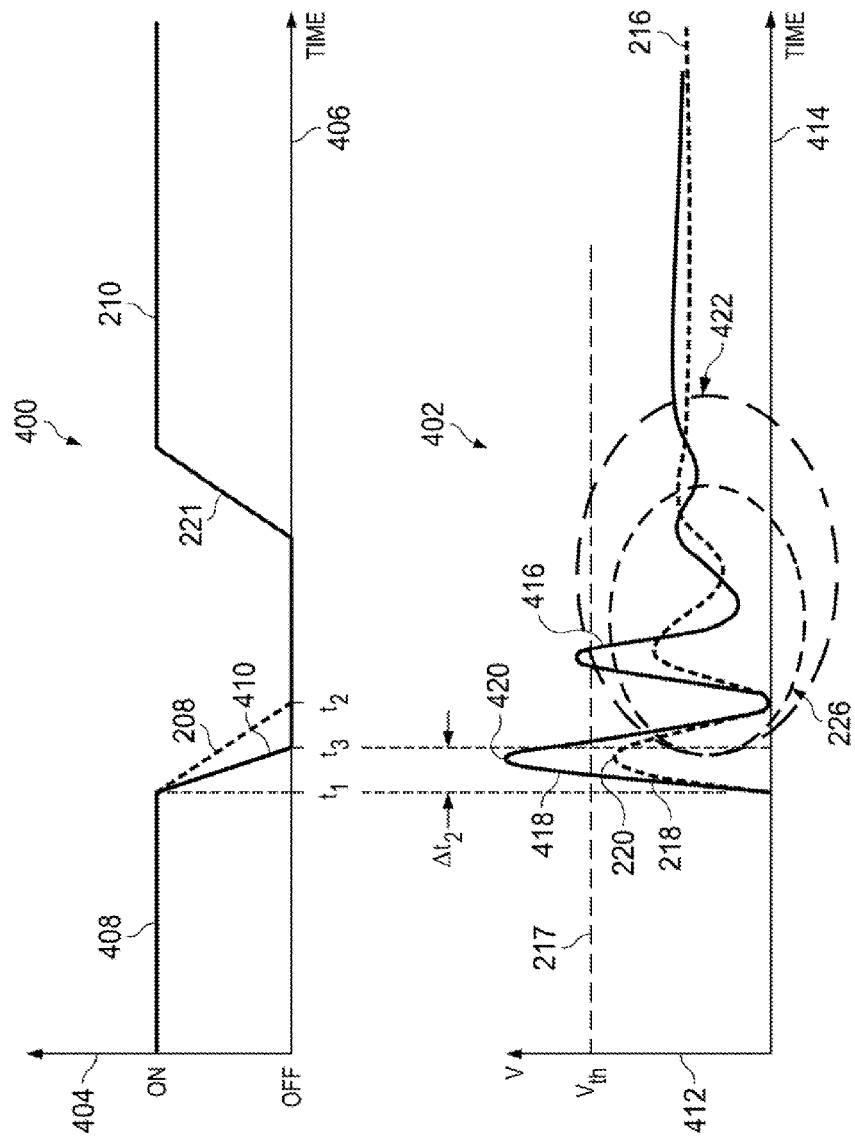
FIG. 4 illustrates the voltage at a node between the n-FET and p-FET when the conventional switched mode inductive DCDC converter of FIG. 1, operating in a less than optimum manner, switches modes.

The figure includes a graph 600 and a graph 602. Graph 600 includes a y-axis 604, an x-axis 606, a pulse 608 and pulse 210. Pulse 208 and pulse 410 of FIGS. 2 and 4, respectively, are additionally shown as dotted lines for comparison purposes. Graph 602 includes a y-axis 612, an x-axis 614, a function 616 and threshold voltage, $V_{th}$, indicated by dotted line 217. Function 216 of FIG. 2 is additionally shown as a dotted line for comparison purposes. Function 416 of FIG. 4 is additionally shown as a dashed line for comparison purposes.

Y-axis 604 has a scale of zero, corresponding to when a FET is OFF, or 1 unit, corresponding to when a FET is ON. X-axis 606 is time and is in units of microseconds. Pulse 608 corresponds to n-FET 130 being ON until time $t_1$. Line 610 corresponds to n-FET 130 turning OFF, until it is fully OFF at time $t_4$, wherein $t_4$ is greater than $t_2$ discussed above with reference to FIG. 2. Therefore, in this case, n-FET 130 takes a period of $\Delta t_3$ to turn OFF. At some time later, p-FET 128 turns ON.

Y-axis 612 corresponds to a voltage at the drain of n-FET 130 and is measured in volts. X-axis 614 is time and is in units of microseconds. Function 616 corresponds to a voltage at the drain of n-FET 130 as a function of time. Function 616 includes a rising portion 618, a maximum portion 620 and a ringing portion 622.

As shown in graph 600, n-FET 130 does not immediately turn OFF. It starts to turn OFF at tune $t_1$, and finishes turning OFF at time $t_4$, after $\Delta t_3$. During that period of turning OFF, just as discussed above, the current changes from path 154 to path 156, creating a parasitic voltage $V_{par}$. In this case, the current change is less drastic than that discussed above with reference to FIG. 2. This is because the period, $\Delta t_3$, for n-FET 130 to totally turn OFF in this case, is much greater than the period, $\Delta t_1$, discussed above with reference to FIG. 2. This can easily be seen by comparing pulse 208 with pulse 610 in FIG. 6.

Just as in the previous example discussed with reference to FIG. 2, in this example $V_{par}$ builds at the drain of n-FET 130. The slope of rising portion 618 is a function of the rate at which n-FET 130 turns OFF, i.e., in this case, $\Delta t_3$. In this case, the slope of rising portion 618 is much less than the slope of rising portion 218 of function 216. The decreased slope translates into a smaller voltage build up, which can be seen by comparing maximum portion 620 to maximum portion 220 of function 216.

In this situation, for purposes of discussion, let some components operating inefficiently as a result of degradation, such that the period it takes for n-FET 130 to totally turn OFF would have been similar to the situation discussed above with reference to FIG. 4. The addition of resistor 504 and capacitor 506 effectively extends the turn OFF period. This turn OFF period extension can be easily seen by comparing pulse 410 (shown by the dotted line) with pulse 608. In this case, as compared to that of FIG. 4 discussed above, period $\Delta t_3 < \Delta t_2$. The increased turn OFF period enables less charge to build at the source of n-FET 130. In fact the amount, indicated by maximum portion 622, is much less than $V_{th}$. In this case then, p-FET 128 avoids the risks of being damaged. Finally, similar to the situation discussed above with reference to FIG. 2, in this case, parasitic capacitances in n-FET 130 resonate with the parasitic inductors within the circuit to generate ringing portion 622. However, this ringing is much less because maximum portion 622 is much less than maximum portion 224.

As such, the static bias provided by resistor 504 and capacitor 506 may reduce the likelihood of damage to a component. However, the increased turn OFF period reduces the overall speed of the circuit. Further, the static bias provided by resistor 504 and capacitor 506 provides the same bias for every situation.

Another aspect of the present invention, which is drawn to sensing a voltage for the drain voltage of n-FET 130 that is then used to regulate the turn OFF period of n-FET 130, is adaptive and may be used for many situations. This aspect drawn to extending the turn OFF period of n-FET 130 via an adaptive bias component will now be described with reference to FIGS. 7-13.

Figure 7:
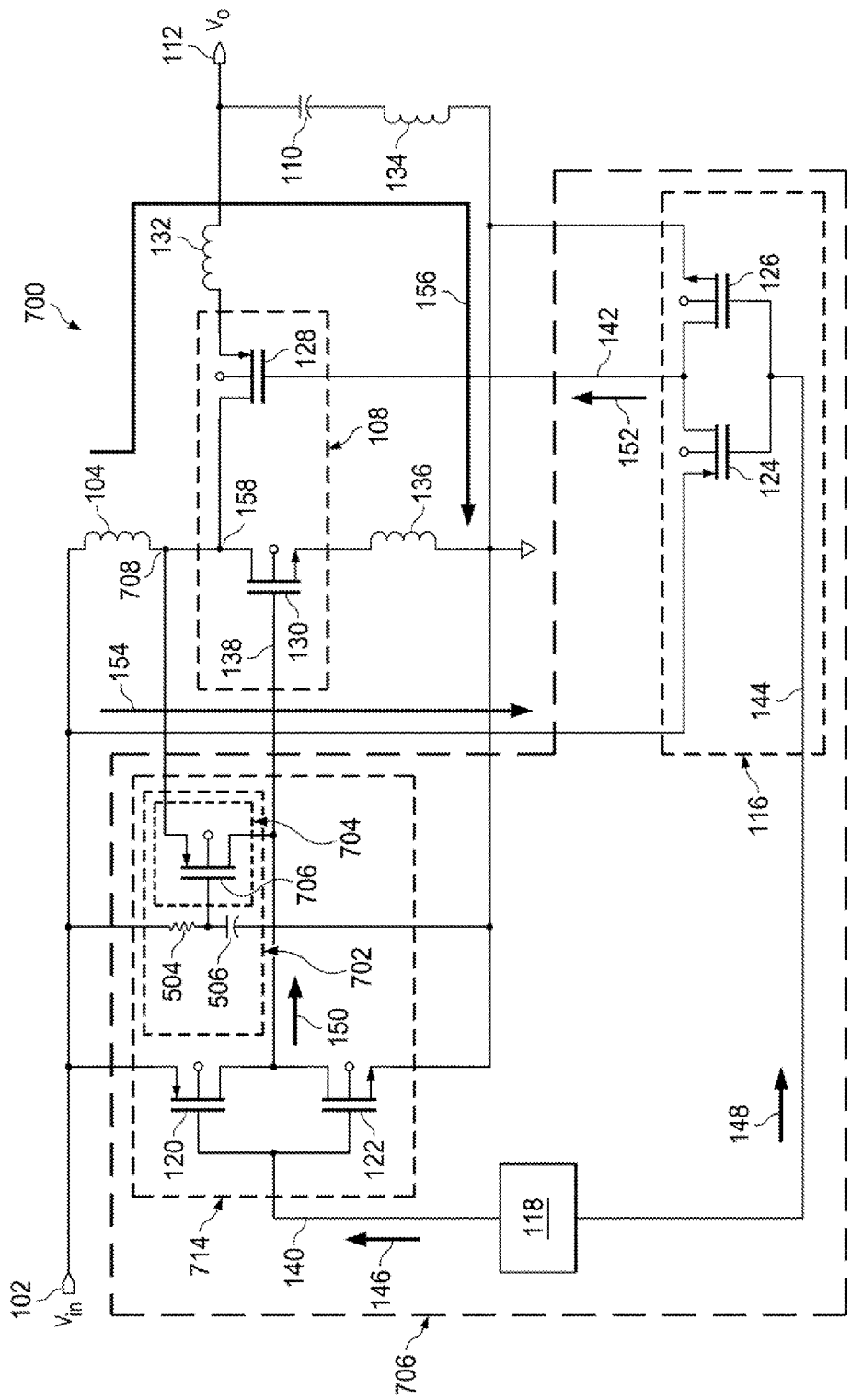
FIG. 7 illustrates an example of another embodiment of a switched mode inductive DCDC converter, in accordance with aspects of the present invention.

FIG. 7 illustrates an example switched mode inductive DCDC converter 700, in accordance with aspects of the present invention.

As shown in the figure, switched mode inductive DCDC converter 700 is similar to switched mode inductive DCDC converter 500 discussed above with reference to FIG. 5, but differs in that: controlling component 506 of switched mode inductive DCDC converter 500 has been replaced with controlling component 706 in switched mode inductive DCDC converter 700, and driving component 514 of switched mode inductive DCDC converter 500 has been replaced with driving component 714 in switched mode inductive DCDC converter 700. Further, bias component 502 of switched mode inductive DCDC converter 500 is replaced with a bias component 702 in switched mode inductive DCDC converter 700. In this example, bias component 702 includes resistor 504, capacitor 506 and a detecting component 704.

The only difference in function and operation between controlling component 506 of switched mode inductive DCDC converter 500 and controlling component 706 of switched mode inductive DCDC converter 700; the only difference between function and operation of driving component 514 of switched mode inductive DCDC converter 500 and driving component 714 of switched mode inductive DCDC converter 700; and the only difference between function and operation of bias component 502 of switched mode inductive DCDC converter 500 and bias component 702 of switched mode inductive DCDC converter 700 lies in the addition of detecting component 704. In this example embodiment, detecting component 704 is a switch 706. Further, in this example embodiment, switch 706 is p-FET.

The source of p-FET 706 is connected to inductor 104, the drain of p-FET 128 and the drain of n-FET 130 at a node 708. The drain of p-FET 706 is connected to the gate of n-FET 130 via line 138. The out of p-FET 706 is connected to resistor 504 mid capacitor 506.

Switched mode inductive DCDC converter 700 operates in a manner similar to switched mode inductive DCDC converter 500 discussed above with reference to FIG. 5, but has one important difference. Switched mode inductive DCDC converter 700 has an adaptive switching speed that is based on a parameter detected by detecting component 704. In one embodiment the detected parameter is voltage at node 708. The turn OFF period of n-FET 130 is modified based on the detected voltage. This will be discussed in greater detail with reference to FIG. 8.

Figure 8:
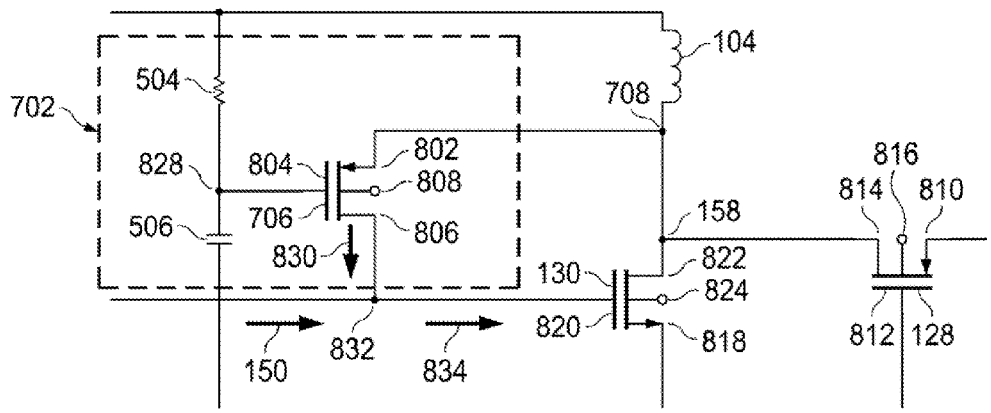
FIG. 8 illustrates an exploded view of a portion of switched mode inductive DCDC converter of FIG. 7.

FIG. 8 illustrates an exploded view of a portion of switched mode inductive DCDC converter 700 of FIG. 7.

As shown in FIG. 8, detecting component 704 includes p-FET 706, which includes a source 802, a gate 804, a drain 806 and a back gate 808. P-FET 128 includes a source 810, a gate 812, a drain 814 and at back gate 816. N-FET 130 includes a source 818, a gate 820, a drain 822 and a back gate 824. Inductor 104, source 802 of p-FET 706, drain 814 of p-FET 128 and drain 822 of n-FET 130 are all connected at node 708. Gate 804, resistor 504 and capacitor 506 are connected at a node 828.

With additional reference to FIG. 7, in this example embodiment, the voltage at node 828 is a filtered $V_{in}$ from input node 102. It should be noted that $V_{in}$ may be any voltage that is smaller than the maximum voltage rating of n-FET 130.

For purposes of discussion, consider the situation where n-FET 130 would be turned OFF so quickly, i.e., have such a short turn OFF period, that it causes a large overvoltage at the drain of n-FET 130. When the voltage at node 708 increases above the voltage at node 828, which is $V_{in}$ in this example, p-FET 706 turns ON and injects a current 830 into node 832. Current 830 combines with the current of bias signal 150 at node 832 such that a modified bias current 834 is provided to gate 820 of n-FET 130. At this point, n-FET 122 of driving component 714 would be ON. This way, p-FET 706 somewhat hinders the pull down of the voltage at gate 820 of n-FET 130 via n-FET 122. Therefore, the speed at which n-FET 130 is turned OFF is reduced, or in other words, the turn OFF period of n-FET 130 is extended.

In accordance with aspects of the present invention, the turn OFF speed for n-FET 130 is regulated according to the drain voltage of n-FET 130. This achieves a maximum switching speed for any given situation and therefore improves efficiency. Further, such regulation of the ON time as a function of the drain voltage decreases the likelihood that the device will be dammed and reduces ringing. This will be described in more detail with reference to FIG. 9.

Figure 9:
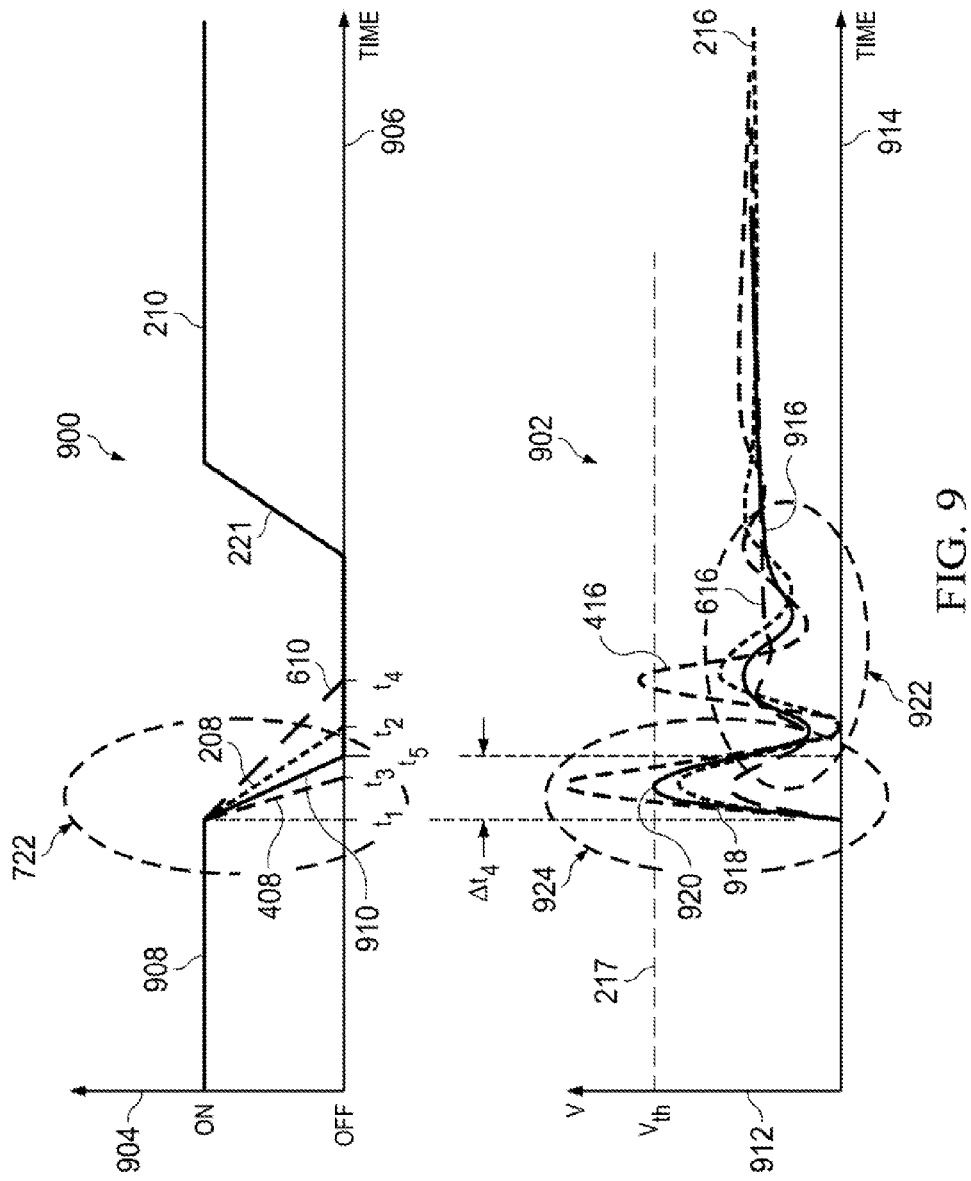
FIG. 9 illustrates the voltage at a node between the n-FET and a p-FET when the switched mode inductive DCDC converter of FIG. 7 switches modes.

FIG. 9 illustrates the voltage at the drain of n-FET 130 when switched mode inductive DCDC converter 700 of FIG. 7 switches modes.

FIG. 9 includes a graph 900 and a graph 902. Graph 900 includes a y-axis 904, an x-axis 906, a pulse 908 and pulse 210. Pulse 208 of FIG. 2 is additionally shown as a dotted line for comparison purposes. Pulse 408 of FIG. 4 is additionally shown as a dashed line for comparison purposes. Pulse 610 is additionally shown as a long-dashed line for comparison purposes. Graph 902 includes a y-axis 912, an x-axis 914, a function 916 and threshold voltage, $V_{th}$, indicated by dotted line 217. Function 216 of FIG. 2 is additionally shown as a dotted line for comparison purposes. Function 416 of FIG. 4 is additionally shown as a dashed line fix comparison purposes. Function 616 of FIG. 6 is additionally shown as a long-dashed line for comparison purposes.

Y-axis 904 has a scale of zero, corresponding to when a FET is OFF, or 1 unit, corresponding to when a FET is ON. X-axis 906 is time and is in units of microseconds. Pulse 908 corresponds to n-FET 130 being ON until time $t_1$. Function 910 corresponds to n-FET 130 turning OFF, until it is fully OFF at time $t_5$, wherein $t_5$ is greater than $t_3$ discussed above with reference to FIG. 4, and wherein $t_5$ is less than $t_2$, discussed above with reference to FIG. 2. Therefore, in this case, n-FET 130 takes a period of $\Delta t_4$ to turn OFF. At some time later, p-FET 128 turns ON.

Y-axis 912 corresponds to a voltage at the drain of n-FET 130 and is measured in volts. X-axis 914 is time and is in units of microseconds. Function 916 corresponds to a voltage at the drain of n-FET 130 as a function of time. Function 916 includes a rising portion 918, a maximum portion 920 and a small ringing portion 922.

As shown in graph 900, n-FET 130 does not immediately turn OFF. It starts to turn OFF at time $t_1$, and finishes turning OFF at time $t_5$, after $\Delta t_4$. During that period of turning OFF, just as discussed above, the current changes from path 154 to path 156, creating a parasitic voltage, $V_{par}$. The effects of $V_{par}$ in this case will be more clearly described with additional reference to FIG. 10.

Figure 10:
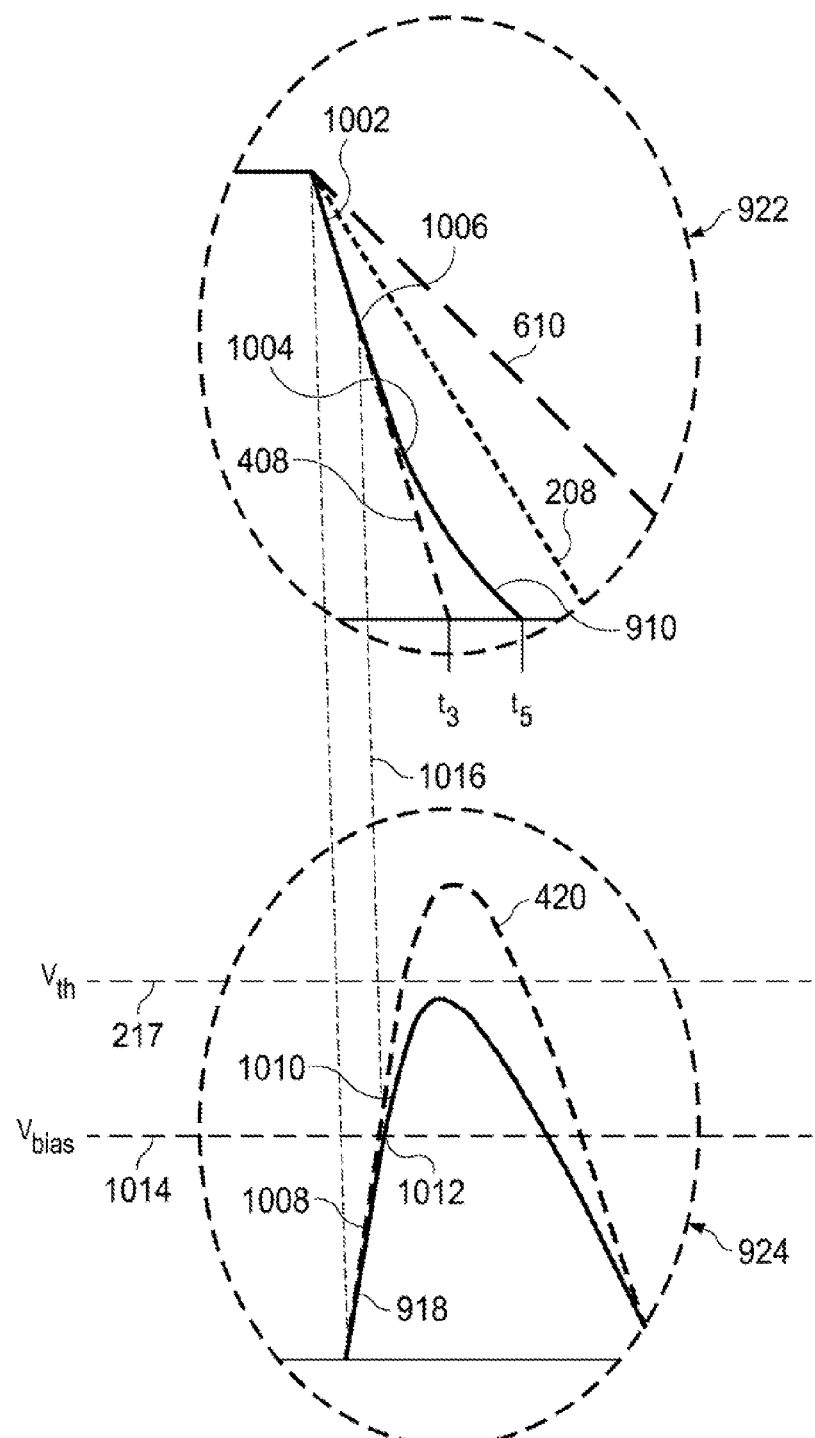
FIG. 10 illustrates an exploded view of a portion of FIG. 9.

FIG. 10 illustrates an exploded view of a portion 922 and portion 924 of FIG. 9.

FIG. 10 shows that function 910 includes a portion 1002, a portion 1004 and an inflexion point 1006 bridging portion 1002 with portion 1004. Portion 1002 has the same slope as pulse 408. FIG. 10 additionally shows that rising portion 918 includes a portion 1008, a portion 1010 and an inflexion point 1012 bridging; portion 1008 with portion 1010. Portion 1010 has the same slope as rising portion 418.

As shown in FIG. 10, suppose in this case that n-FET 130 starts to turn OFF at a rate equal that that discussed above with reference to FIG. 4. In FIG. 10, this is illustrated by portion 1002 of function 910.

Just as in the previous example discussed with reference to FIG. 4, in this example $V_{par}$ builds at the drain of n-FET 130. As shown in FIG. 9, the slope of rising portion 918 is a function of the rate at which n-FET 130 turns OFF. In this case, n-FET 130 initially turns OFF at the same rate as discussed above with reference to FIG. 4. This is shown in FIG. 10 as portion 1002 of function 910 being the same as 408 discussed above with reference to FIG. 4. Therefore in this case, the rate of voltage build up at the drain of n-FET 130 will initially be the same as discussed above with reference to FIG. 4. This is shown in FIG. 10 as portion 1008 of rising portion 918 additionally having the same rate of increase as rising portion 418 discussed with reference to FIG. 4.

However, in accordance with the present invention, $V_{par}$ hits the predetermined threshold $V_{bias}$, as shown by dotted line 1014 at point 1012. As discussed above, $V_{bias}$ is associated with p-FET 706 in conjunction with resistor 504 and capacitor 406. Returning to FIG. 8, $V_{par}$ is sensed by p-FET 706 at node 708. Based on the parameters of p-FET 706, resistor 504 and capacitor 506, when $V_{par}$ matches $V_{bias}$, p-FET 706 injects current 830 into node 832. In this manner, resistor 504 and capacitor 506 are a biasing component providing a bias for p-FET 706. As discussed above, the resulting modified bias current 834 is provided to n-FET 130. The modification of the current provided to n-FET 130 slows the turning OFF of n-FET 130.

Returning to FIG. 10, point 1012, where $V_{par}$ meets $V_{bias}$, corresponds to point 1006, where the turn OFF rate of n-FET 130 changes. This graphic representation illustrates n-FET 130 receiving a modified driving signal, in response to $V_{par}$ equaling $V_{bias}$, which in turn decreases the turn OFF rate of n-FET 130. As p-FET 706 continues to provide a current to n-FET 130, the turn OFF rate of n-FET 130 follows portion 1004. As a result, the turn OFF period of n-FET 130 is extended from $\Delta t^2$ to $\Delta t_4$.

Further, because the turn OFF rate of n-FET 130 is reduced, as shown in portion 1004, the rate charge build up at the drain of n-FET 130 is also reduced, as shown by portion 1010 of rising portion 918. This additionally reduces the maximum charge built up at the drain of n-FET 130. To further explain effect of the modified turn OFF rate of n-FET 130, it is helpful to see a correlation with the voltage at gate 820 as compared to the voltage at node 708. This will be described with additional reference to FIG. 11.

Figure 11:
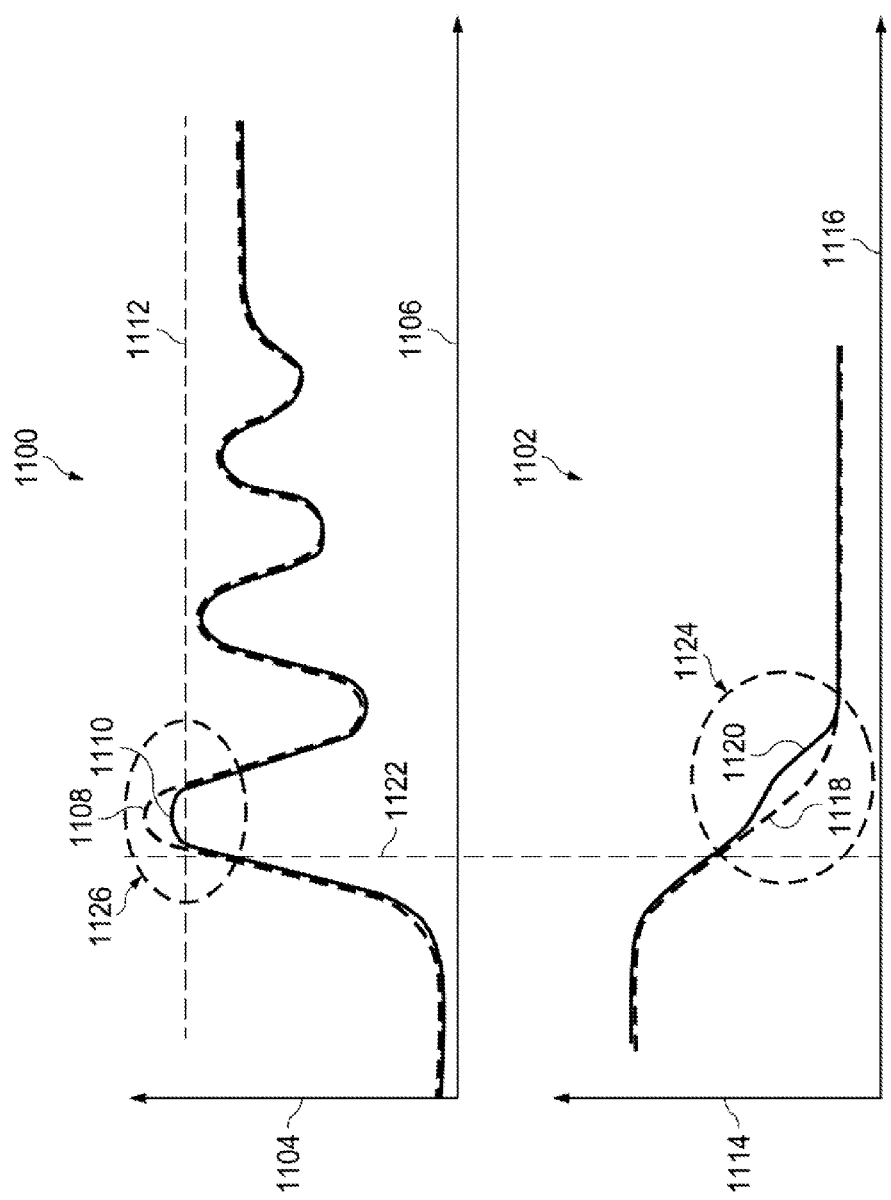
FIG. 11 illustrates the voltage at a node between the n-FET and a p-FET when the switched mode inductive DCDC converter of FIG. 7 switches modes, as compared to the voltage at the gate of the n-FET.

FIG. 11 illustrates the voltage at node 708 when switched mode inductive DCDC converter of 700 switches modes, as compared to the voltage at gate 820 of n-FET 130.

FIG. 11 includes a graph 1100 and a graph 1102. Graph 1100 includes a y-axis 1104, an axis 1106, a function 1108, a function 1110 and threshold voltage, $V_{th}$, indicated by dotted line 1112. Graph 1102 includes a y-axis 1114, an x-axis 1116, a function 1118 and a function 1120.

Y-axis 1104 is in volts. X-axis 1106 is time and is in units of microseconds. Function 1108 corresponds to voltage at node 158 of conventional switched mode inductive DCDC converter 100 as a function of time. Function 1110 corresponds to voltage at node 708 of switched mode inductive DCDC converter 700 as a function of time. Threshold voltage, $V_{th}$, indicated by dotted line 1112 corresponds to the bias provided by bias component 702.

Y-axis 1114 corresponds to a voltage. X-axis 1114 is time and is w units of microseconds. Function 1118 corresponds to a voltage at gate 820 of n-FET 130 of conventional switched mode inductive DCDC converter 100 as a function of time. Function 1120 corresponds to a voltage at gate 820 of n-FET 130 of switched mode inductive DCDC converter 700 as a function of time.

As shown in graph 1102, while n-FET 130 is turned off (Gate voltage going low), detecting component 704 of switched mode inductive DCDC converter 700 detects the voltage at node 708. At a time indicated by dotted line 1122, the voltage at node 708 exceeds the threshold voltage, $V_{th}$, provided by resistor 504 and capacitor 506 of bias component 702. At this time, as shown by dashed ellipse 1124 in graph 1102, the switching characteristic of n-FET 130 is changed. In this particular instance, the turn OFF period of n-FET 130 is extended. The extended turn OFF period is easily seen as comparing the function 1120 within dashed ellipse 1124 with function 1118 within dashed ellipse 1124. Again, it should he noted that function 1118 corresponds to a voltage at gate 820 of n-FET 130 of conventional switched mode inductive DCDC converter 100 as a function of time.

As shown in graph 1100, when the threshold voltage, $V_{th}$, is exceeded, and the switching process is slowed down, voltage at node 708 does not to much higher. The reduced voltage at node 708 is easily seen as comparing the function 1110 within dashed ellipse 1126 with function 1108 within dashed ellipse 1126. Again, it should be noted that function 1108 corresponds to a voltage at node 158 of conventional switched mode inductive DCDC converter 100 as a function of time. In the end, this is a regulation loop that adjusts the switching speed of n-FET 130 while n-FET 130 is switching.

Returning to FIG. 9, because the ringing of the voltage, as indicated by ringing portion 922, is an exponentially decreasing sinusoidal function based on the resonances between the parasitic capacitors and inductors within switched mode inductive DCDC converter 700. As discussed in FIG. 11, because the initial voltage maximum at node 708 is decreased, as compared to the initial voltage maximum at node 158 of conventional switched mode inductive DCDC converter 100 the overall ringing is decreased in switched mode inductive DCDC converter 700. Simulations have shown the benefits of the adaptive bias provided by n-FET 128 in conjunction with resistor 504 and capacitor 506. These will now be discussed with reference to FIGS. 12-13.

Figure 12:
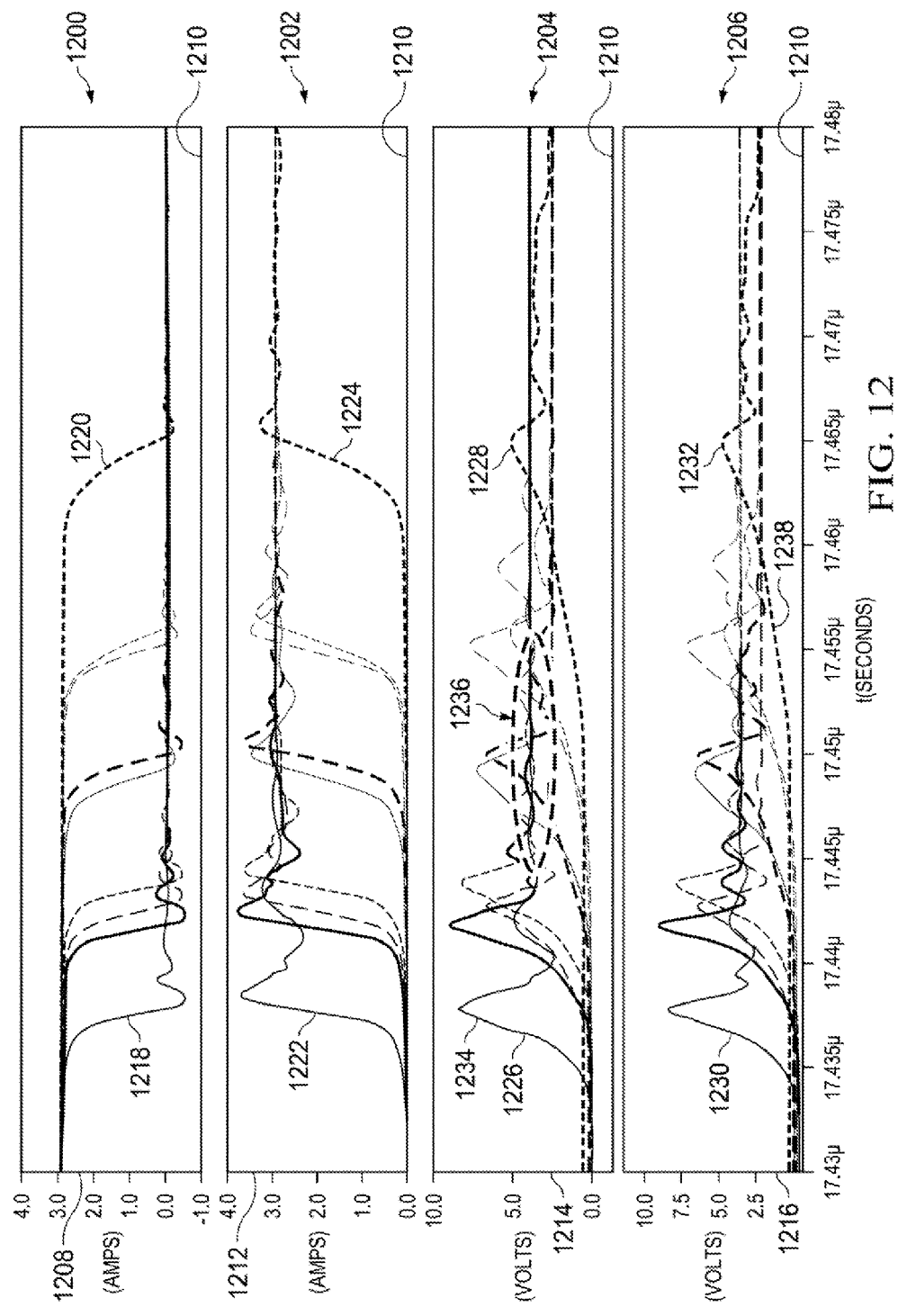
FIG. 12 illustrates includes a plurality of graphs showing performance of multiple examples of conventional switched mode inductive DCDC converter.

FIG. 12 includes a plurality of graphs showing performance of multiple examples of conventional switched mode inductive DCDC converter 100.

The figure includes a graph 1200, a graph 1202, a graph 1204 and a graph 1206.

Graph 1200 includes a y-axis 1208 in amps and an x-axis 11.210 in microseconds. Graph 1200 includes a plurality of functions, samples of which are labeled, as function 1218 and function 1220. Each function in graph 1200 corresponds to the current in the drain of n-FET 130 as a function of time.

Graph 1202 includes a y-axis 1212 in amps and x-axis 1210 in microseconds. Graph 1202 includes a plurality of functions, samples of which are labeled as function 1222 and function 1224. Each function in graph 1202 corresponds to the current in the drain of p-FET 128 as a function of time.

Graph 1204 includes a y-axis 1214 in volts and x-axis 1210 in microseconds. Graph 1204 includes a plurality of functions, samples of which are labeled as function 1226 and function 1228. Each function in graph 1204 corresponds to the voltage at the node of inductor 104, p-FET 128 and n-FET 130 as a function of time.

Graph 1206 includes a y-axis 1216 in volts and x-axis 1210 in microseconds. Graph 1206 includes a plurality of functions, samples of which are labeled as function 1230 and function 1232. Each function in graph 1206 corresponds to the drain to source voltage at n-FET 130 as a function of time.

Ten different examples of conventional switched mode inductive DCDC converter 100 were used to obtain the results shown in graphs 1200, 1202, 1204 and 1206. The example circuits differed in many aspects, such as operating temperature, transistor amp rating, etc. The results for each respective example conventional switched mode inductive DCDC converter 100 have a common line shape. For example, functions 1218, 1222, 1226 and 1230 may all belong to one specific tested conventional switched mode inductive DCDC convener 100 having strong FETs and operating at a low temperature. On the other hand, functions 1220, 1224, 1228 and 1232 all belong to another specific tested conventional switched mode inductive DCDC converter 100 having weak FETs and operating at a high temperature.

From a performance point of view, it is desired for the current related functions, as shown in graphs 1200 and 1202, have similar behavior, such as a similar dI/dt, e.g., the speed at which the current changes. Further, important features for the voltage related functions, as shown in graphs 1204 and 1206, are drawn to: the amplitude of the first peak (overshoot), for example, item 1234 of function 1226 in graph 1214; the amount of ringing, for example as illustrated by dashed ellipse 1236; and the speed at which the voltage increases. In particular, the faster the voltage increases, the lower the losses. For example, as shown in function 1232 of graph 1206, portion 1238 indicates a very slow increase in voltage, which translates into great losses and low efficiency.

To compare the results shown in graphs 1200, 1202, 1204 and 1206, similar circuits were used, but each similar circuit included therein a p-FET arranged as p-FET 706 as discussed above with reference to switched mode inductive DCDC convener 700 in FIG. 7. These results will now be described with reference to FIG. 13.

Figure 13:
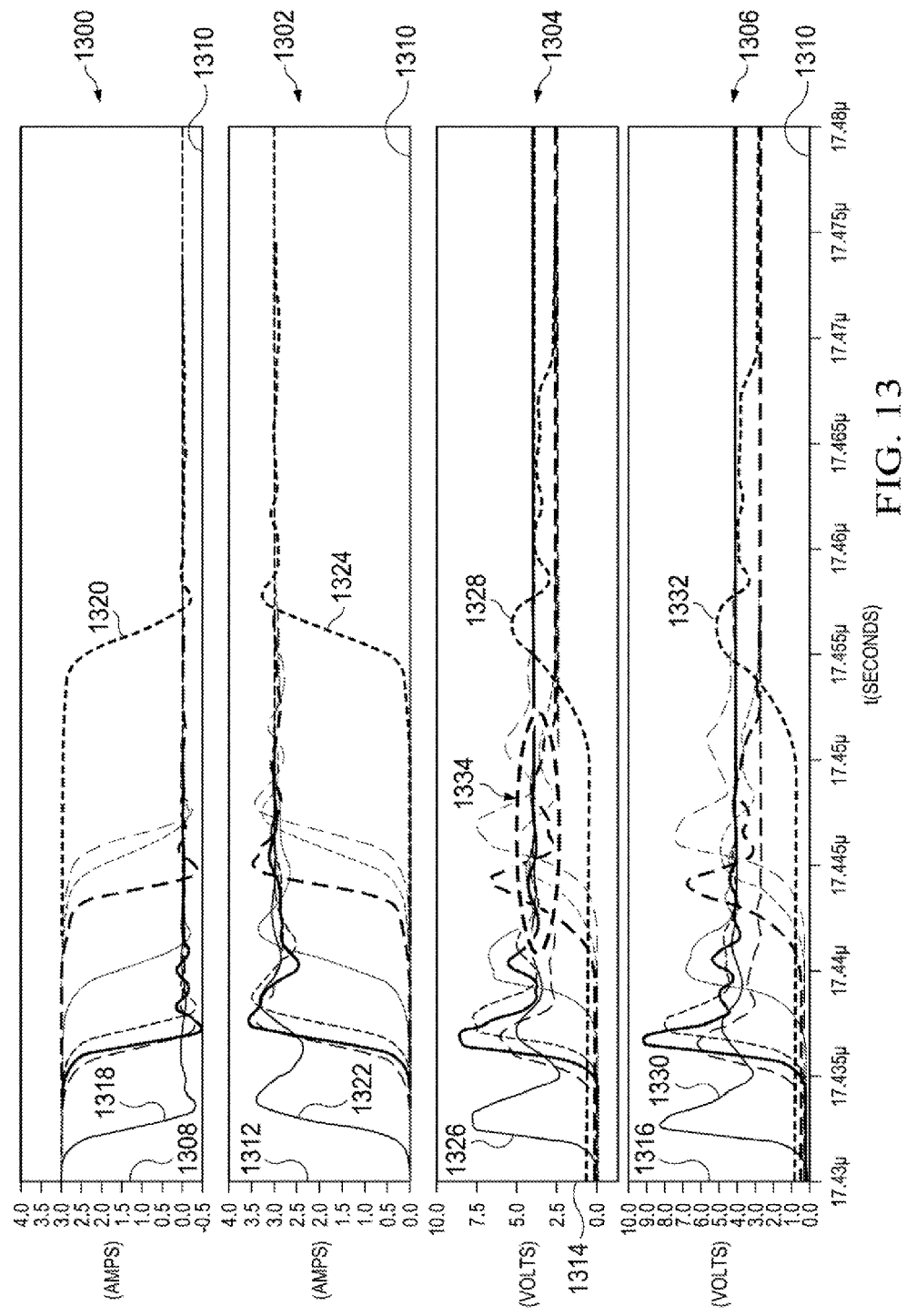
FIG. 13 includes a plurality of graphs showing performance of multiple examples of switched mode inductive DCDC converter in accordance with aspects of the present invention.

FIG. 13 includes a plurality of graphs showing performance of multiple examples of switched mode inductive DCDC convener 700.

The figure includes a graph 1300, a graph 1302, a graph 1304 and a graph 1306.

Graph 1300 includes a y-axis 1308 in amps and an x-axis 1310 in microseconds. Graph 1300 includes a plurality of functions, samples of which are labeled as function 1318 and function 1320. Each function in graph 1300 corresponds to the current in the drain of n-FET 130 as a function of time.

Graph 1302 includes a y-axis 1312 in amps and x-axis 1310 in microseconds. Graph 1302 includes a plurality of functions, samples of which are labeled as function 1322 and function 1324. Each function in graph 1302 corresponds to the current in the drain of p-FET 128 as a function of time.

Figure 1:
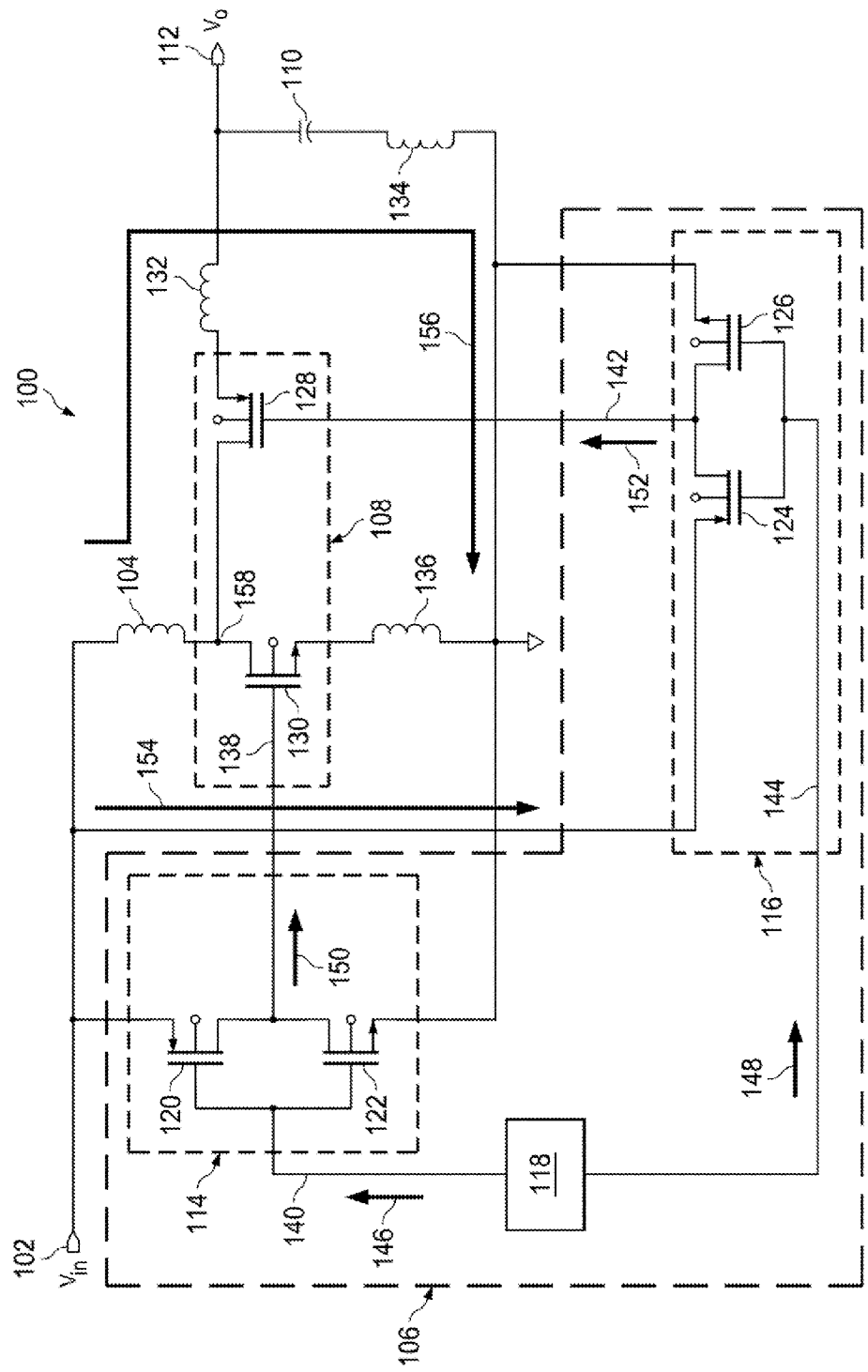
FIG. 1 illustrates a conventional switched mode inductive DCDC converter.

Graph 1304 includes a y-axis 1314 in volts and x-axis 1310 in microseconds. Graph 1304 includes a plurality of functions, samples of which are labeled as function 1326 and function 1328. Each function in graph 1304 corresponds to the voltage at node 708 as shown in FIG. 7 (as compared to graph 1204 in FIG. 12, which corresponds the node 158 of as shown in FIG. 1, as a function of time.

Graph 1306 includes at y-axis 1316 in volts and x-axis 1310 in microseconds. Graph 1306 includes a plurality of functions, samples of which are labeled as function 1330 and function 1332. Each function in graph 1306 corresponds to the drain to source voltage at n-FET 130 as a function of time.

Ten different examples of switched mode inductive DCDC converter 700 were used to obtain the results shown in graphs 1300, 1302, 1304 and 1306. The example circuits dialed in the same ways as the corresponding circuits used to obtain the results in graphs 1200, 1202, 1204 and 1206, respectively. The results for each respective example switched mode inductive DCDC converter 700 has a common line shape, e.g., functions 1318, 1322, 1326 and 1330 all belong to one specific tested switched mode inductive DCDC converter 700, whereas 1320, 1324, 1328 and 1332 all belong to another specific tested switched mode inductive DCDC converter 700.

What is easy to notice when comparing the current-related results between FIG. 12 and FIG. 13 is that the current slope is generally greater in FIG. 13. For example, the slope of function 1320 in graph 1300 of FIG. 13 is greater than the slope of function 1220 in graph 1200 of FIG. 12. Further, the variation in the slopes of the functions in graph 1300 of FIG. 13 is generally less than the variation in the slopes of the functions in graph 1200 of FIG. 12.

What is additionally easy to notice when comparing the results between graphs 1204 and 1304 is that the peaks are generally clipped in the functions in graph 1304 of FIG. 13. This clipping reduces the likelihood of damage to components. Further, the positive slopes in the first peaks of the functions in graph 1304 of FIG. 10 are generally greater than the slopes in the first peaks of the functions in graph 1204 of FIG. 12. Finally, the amount of ringing, for example as illustrated by dashed ellipse 1334, is generally lower as compared u the functions in graph 1204.

The example embodiments discussed above are drawn to a switched mode inductive DCDC converter, wherein a voltage build up at a drain of a FET in the power stage is detected and the driving current to the gate of the FET is subsequently modified to extend the switching time. In the example discussed above with reference to FIGS. 7-8, a p-FET is used to monitor the voltage at the drain of the n-FET in the power stage. However, in other embodiments, a p-FET may be used to monitor the voltage of at the drain of the p-FET in the power stage in a similar manner.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A circuit operable to receive an input DC voltage and to output an output DC voltage, said circuit comprising:
    an inductor operable to generate a converted voltage based or the input DC voltage;
    an output node operable to output the output DC voltage;
    a first field effect transistor disposed in series between said inductor and said output node;
    a second field effect transistor disposed in series between said inductor and ground;
    a controller operable to generate a control signal to control one of said first field effect transistor and said second field effect transistor, the control signal being able to control said one of said first field effect transistor and said second field effect transistor to be in a first state, to control said one of said first field effect transistor and said second field effect transistor to be in a second state, to control said one of said first field effect transistor and said second field effect transistor to switch from the first state to the second state and to control said one of said first field effect transistor and said second field effect transistor to switch from the second state to the first state; and
    a detecting component operable to detect a parameter associated with one of said first field effect transistor and said second field effect transistor and to output a bias signal based on the detected parameter,
    wherein, in the first state, one of said first field effect transistor and said second field effect transistor is ON and the other of said first field effect transistor and said second field effect transistor is OFF,
    wherein, in the second state, the one of said first field effect transistor and said second field effect transistor is OFF and the other of said first field effect transistor and said second field effect transistor is ON,
    wherein said detecting component is arranged with said controller such that the bias signal modifies the control signal so as to extend a turn OFF time, and
    wherein the switching time is one of when said first field effect transistor switches from the first state to the second state, when said second field effect transistor switches from the first state to the second state, when said first field effect transistor switches from the second state to the first state, and when said second field effect transistor switches from the second state to the first state.

2. The circuit of claim 1, wherein said detecting component is operable to detect a voltage associated with said first held effect transistor.

3. The circuit of claim 2, wherein said first field effect transistor is a p-FET.

4. The circuit of claim 3,
    wherein said p-FET includes a drain, a gate and a source,
    wherein said source is connected to said output node,
    wherein said drain is connected to said inductor, and
    wherein said detecting component operable to detect the voltage as a voltage at said drain.

5. The circuit of claim 4, wherein said detecting component comprises a third field effect transistor.

6. The circuit of claim 5,
    wherein said third field effect transistor is a second p-FET,
    wherein said second p-FET includes a second drain, a second gate and a second source,
    wherein said second source is connected to said inductor, and
    wherein said second drain is operable to output the bias signal.

7. The circuit of claim 6, wherein said second drain is connected to said second field effect transistor.

8. The circuit of claim 7,
    wherein said second field effect transistor is an n-FET, wherein said n-FET includes a third drain, a third gate and a third source,
wherein said second drain is connected to said third gate such that the bias signal is provided to said third gate.

9. The circuit of claim 8, further comprising a biasing component connected to said second gate.

10. The circuit of claim 1, wherein said detecting component is operable to detect a voltage associated with said second field effect transistor.

11. The circuit of claim 10, wherein said second field effect transistor is an n-FET.

12. The circuit of claim 11, wherein said n-FET includes a drain, a gate and a source,
wherein said source is connected to ground,
wherein said drain is connected to said inductor, and
wherein said detecting component operable to detect the voltage as a voltage at said drain.

13. The circuit of claim 1, wherein said detecting component comprises a third field effect transistor.

14. The circuit of claim 13,
wherein said third field effect transistor is a p-FET,
wherein said p-FET includes a drain, a gate and a source,
wherein said source is connected to said inductor, and
wherein said drain is operable to output the bias signal.

15. The circuit of claim 14, wherein said drain is connected to said second field effect transistor.

16. The circuit of claim 15,
wherein said first field effect transistor is a second p-FET,
wherein said second p-FET includes a second drain, a second gate and a second source,
wherein said second source is connected to said output node,
wherein said second drain is connected to said inductor.

17. The circuit of claim 16, further comprising a biasing component connected to said gate.

18. The circuit of claim 17,
wherein said biasing component comprises a resistor and a capacitor,
wherein said resistor is arranged to receive the input DC voltage and is connected to said gate, and
wherein capacitor is connected to said gate and ground.

19. The circuit of claim 14, further comprising a biasing component connected to said gate.

20. The circuit of claim 9,
wherein said biasing component comprises a resistor and a capacitor,
wherein said resistor is arranged to receive the input DC voltage and is connected to said gate, and
wherein capacitor is connected to said gate and ground.

* * * * *